United States Patent
Lee et al.

(10) Patent No.: US 7,138,336 B2
(45) Date of Patent: Nov. 21, 2006

(54) PLASMA ENHANCED ATOMIC LAYER DEPOSITION (PEALD) EQUIPMENT AND METHOD OF FORMING A CONDUCTING THIN FILM USING THE SAME THEREOF

(75) Inventors: Chun Soo Lee, Daejeon (KR); Min Sub Oh, Daejeon (JP); Hyung Sang Park, Seoul (KR)

(73) Assignee: ASM Genitech Korea Ltd., Daedeoggu (KR)

( * ) Notice: Subject to any disclaimer, the term of this patent is extended or adjusted under 35 U.S.C. 154(b) by 0 days.

(21) Appl. No.: 10/486,311

(22) PCT Filed: Aug. 6, 2001

(86) PCT No.: PCT/KR01/01333

§ 371 (c)(1), (2), (4) Date: Feb. 6, 2004

(87) PCT Pub. No.: WO03/023835

PCT Pub. Date: Mar. 20, 2003

(65) Prior Publication Data

US 2004/0231799 A1   Nov. 25, 2004

(51) Int. Cl.
H01L 21/44 (2006.01)
H01L 21/311 (2006.01)

(52) U.S. Cl. .............. 438/680; 438/685; 438/695; 118/729

(58) Field of Classification Search .............. 438/680, 438/685, 695; 118/729
See application file for complete search history.

(56) References Cited

U.S. PATENT DOCUMENTS

| | | | | |
|---|---|---|---|---|
| 4,949,671 A | * | 8/1990 | Davis et al. ............... 118/725 |
| 5,811,022 A | * | 9/1998 | Savas et al. ............... 216/68 |
| 5,963,840 A | * | 10/1999 | Xia et al. ............... 438/783 |
| 6,174,377 B1 | * | 1/2001 | Doering et al. ............ 118/729 |
| 6,230,651 B1 | * | 5/2001 | Ni et al. ............... 118/723 I |
| 6,268,288 B1 | * | 7/2001 | Hautala et al. ............ 438/680 |
| 6,539,891 B1 | * | 4/2003 | Lee et al. ............... 118/723 E |
| 6,551,447 B1 | * | 4/2003 | Savas et al. ........... 156/345.48 |
| 6,740,247 B1 | * | 5/2004 | Han et al. ............... 216/73 |

(Continued)

FOREIGN PATENT DOCUMENTS

KR   10-1999-0011877   4/1999

OTHER PUBLICATIONS

English Language Abstract of Korean Patent Application No. 10-1999-0011877.

*Primary Examiner*—Alexander Ghyka
(74) *Attorney, Agent, or Firm*—Knobbe Martens Olson & Bear LLP (57) ABSTRACT

A plasma enhanced atomic layer deposition (PEALD) apparatus and a method of forming a conductive thin film using the same are disclosed. According to the present invention of a PEALD apparatus and a method, a process gas inlet tube and a process gas outlet tube are installed symmetrically and concentrically with respect to a substrate, thereby allowing the process gas to flow uniformly, evenly and smoothly over the substrate, thereby forming a thin film uniformly over the substrate. A uniquely designed showerhead assembly provides not only reduces the volume of the reactor space, but also allows the process gases to flow uniformly, evenly and smoothly throughout the reation space area and reduces the volume of the reaction space, and the smaller volume makes it easier and fast to change the process gases for sequential and repeated process operation.

46 Claims, 5 Drawing Sheets

U.S. PATENT DOCUMENTS 6,756,318 B1 * 6/2004 Nguyen et al. ............. 438/758

6,764,546 B1 * 7/2004 Raaijmakers ................ 117/93

* cited by examiner

PLASMA ENHANCED ATOMIC LAYER DEPOSITION (PEALD) EQUIPMENT AND METHOD OF FORMING A CONDUCTING THIN FILM USING THE SAME THEREOF

CROSS-REFERENCE TO RELATED APPLICATION DATA

This application claims priority from PCT International Application No. PCT/KR01/01333 filed Aug. 6, 2001.

BACKGROUND OF THE INVENTION

1. Field of the Invention

The present invention relates to a plasma enhanced atomic layer deposition (PEALD) apparatus and method of forming a thin film using the same. Particularly, the present invention relates to a PEALD apparatus and method of forming a thin film using the same, whereby a thin film is formed to an atomic layer thickness by periodically supplying time-divisional (sequential) combination of process gases to a reactor, during which plasma is generated adequately and synchronously with process gases on top of a substrate in order to accelerate the process reaction and facilitate more efficient reaction.

2. Description of the Related Art

As semiconductor integration technologies advance, process methods for depositing a thin film uniformly and conformally become increasingly important. Here, the thin film may be an insulator or a conductor. Thin film deposition methods are largely categorized into two types: chemical vapor deposition (CVD) and physical vapor deposition (PVD). In a CVD, gas phase materials generally react over the top surface of a substrate heated to a temperature of 100–1,000 degree. C., whereby a compound produced as a result of such reaction is deposited on the top surface of the substrate. On the other hand, the PVD method such as sputtering deposition or simply sputtering, are widely used, whereby the process takes place also in a vacuum state in a reactor. When a gas such as Ar gas as an example is supplied to a reactor, the Ar gas becomes positively ionized by a plasma and attracted to a target located inside the reactor. As the ionized Ar atoms get closer to the target, they get accelerated further and as the ionized and accelerated Ar atoms strike the target, the material of the target is scattered and deposited on the surface of a substrate, wherein the material of the target is deposited on the surface of a substrate without a chemical or structural change.

The advantage of a PVD is to make it possible to deposit an alloy or an insulator. Nonetheless the less CVD is more widely used since CVD has advantages over PVD, causing less damage to substrates on which a thin film is deposited, offering low thin film deposition cost, and capability of thin film deposition.

However, as the density of semiconductor devices recently continues to increase from micrometers to nanometers, conventional CVD methods do not perform satisfactorily in forming a thin film uniformly in thickness in nano scale on a substrate or achieving an excellent step coverage. In particular, in case of high aspect ratio, in turn large step difference, such as contact holes, vias or trenches, of small dimensions than micrometer (micron), difficulty exists in forming a thin film having uniform composition regardless of high aspect ratios in various patterns such as contacts, via holes or trenches over the entire surface of the substrate.

Unlike conventional CVD method, where all process gases are simultaneously supplied (in flow) or removed (outflow). In ALD method each atomic layer of thin film is formed by repeating the thin film deposition process by avoiding the direct contact of process gases on the substrate surface and by replacing the process gases rapidly and sequentially within the process gas cycles. This new method of forming thin films is being developed and used.

When the aforementioned atomic Layer Deposition method is used, the deposition takes place only by the material that is adsorbed on the surface of a substrate, i.e., only by the chemical molecule that contains the elements for forming a thin film, whereby a thin film is formed uniformly over the entire surface of a substrate regardless of the quantity of the process gas because the amount of adsorption is on the surface of a substrate is limited by the thickness of a mono layer. Therefore, a uniform thickness of thin film can be formed regardless of the location of the areas of high aspect ratio, in turn, large step difference, and even a thin film with the level of thickness of several nano meters can be formed, and also the thickness of the thin film can be controlled by adjusting the time-divisional combinations of the steps of the formation processes. Furthermore, it is possible to control the thickness of the thin film being formed because the thickness of the thin film formed by deposition during the process gas supply cycle is almost constant.

According to the conventional ALD method described above, in order to avoid mixing of gas materials in a gas phase supplied to a reactor in a time-division mode, remaining deposition gas or reaction gas molecules excluding those adsorbed on the substrate surface among deposition gas or reaction gas supplied to the reactor should be removed, for which the processes of vacuum evacuating the deposition gas or reactant gas from the reactor for several seconds or purging those gas out of the reactor by feeding an inert gas such as Argon gas, must be included in the cycle of gas supply and evacuation thereof.

Accordingly, use of a conventional CVD equipment, in which supply and removal of process gases cannot be made at a fast rate at the speed within several seconds, may increase the deposition time required for obtaining a thin film of a desired thickness because the longer time needed for replacing the process gas. Increased deposition time reduces the number of wafers to be processed per unit time by one equipment, thereby increasing the processing cost. As the deposition time increases, the number of wafers that can be processed with each equipment decreases, thereby, the cost of process increases. Therefore, it is necessary to reduce the deposition time in order to utilize ALD methods for producing semiconductor products using ALD methods.

Figure 1A:
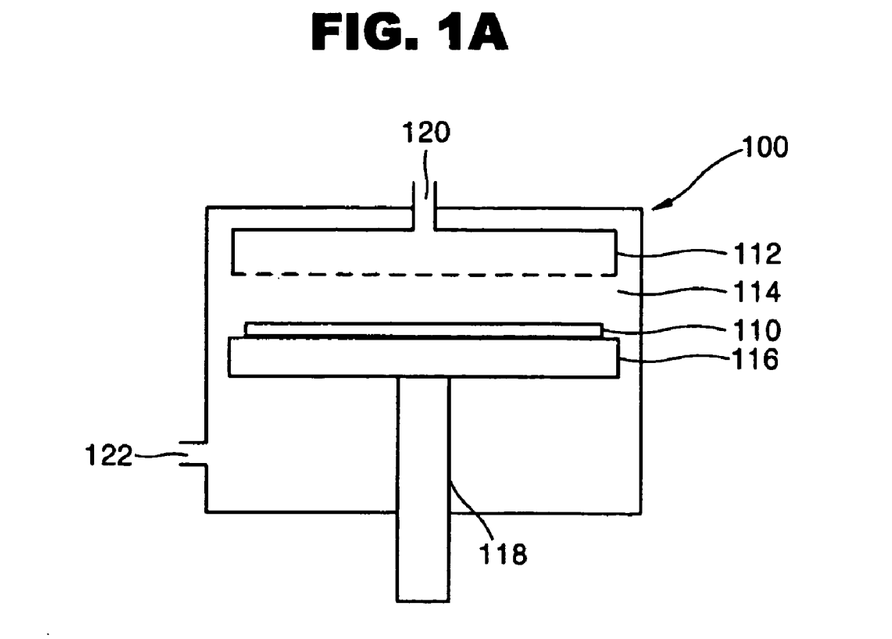
FIGS. 1a and 1b are conceptual schematic drawings of conventional chemical vapor deposition apparatus.
Figure 1B:
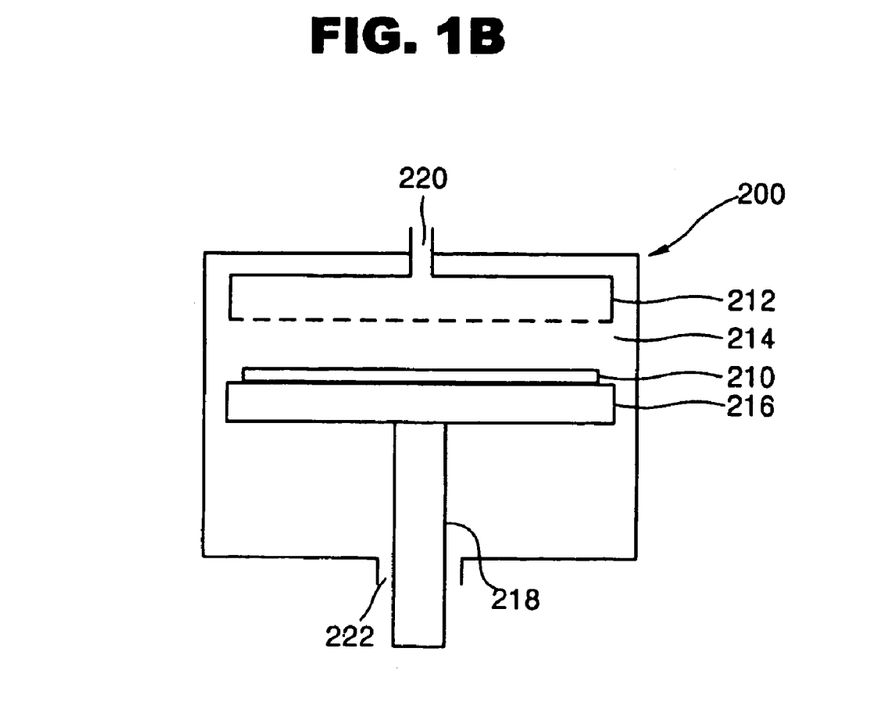

FIGS. 1a and 1b show two schematic structure of a conventional chemical vapor deposition apparatus.

Referring to FIG. 1a as a first prior art of an Atomic Layer Deposition(ALD), at the top part of a reactor 100 gas inlet tube 120 that supplies process gases including deposition gas, reactant gas, purge gas is located, and on the side of the reactor 100, a gas outlet tube 122 for discharging the process gases from the reactor 100 is located. Inside the reactor 100, a substrate carrier 116 is located on which a substrate 110 is loaded. Inside the reactor 100, a showerhead 112 is located and at the top and in the middle of the showerhead 112, the process gas inlet tube 120 is connected. In the lower part of the reactor 100, a substrate carrier driver 118 is mounted. This substrate carrier driver 118 moves the substrate carrier 116 up and down in order to load and unload a substrate onto and out of the substrate carrier 116. This substrate carrier 116 is linked to the substrate carrier driver 118.

The process gas inside the reaction chamber 114 travels through the space between the reactor 100 and the substrate carrier 116 and then exhausted through the gas outlet tube 122. In this prior art, the gas outlet tube 122 and the gas inlet tube 120 are arranged asymmetrically with respect to the substrate 110, that is, the gas flow is imbalanced, thereby the flow of the process gas is biased towards the gas outlet tube 122.

Therefore, when a thin film is deposited on a substrate 110, if the flow of process gas is shifted forwards one side within the reaction chamber 114, the process gas is supplied unevenly over a substrate 110, thereby there is a tendency of forming a thinner film over a substrate 110 where there is less supply of process gas.

Accordingly, in order to minimize the imbalanced flow of process gas in the reactor 100, either the gas outlet tube must be preferably moved away from the substrate 110 or a means of even flow of process gas over the substrate 110 or the outflow tube 122 must preferably be relocated in such a way that the condition of flow of process gas over the substrate 110 is satisfied. However, the gas outlet tube 122 is relocated away from the substrate 110, the volume of the reaction chamber 114 increases, thereby the process cost increases due to the fact that the amount of gas for the same process step increases, and furthermore there is a difficulty of increased process time for supplying and removing gases or replacing process gases for the process of sequentially supplying various types of process gases. Therefore, the process time increases for processing ALD(Atomic Layer Deposition) method.

Further, in the example of this prior art, the substrate carrier 116 and the substrate carrier driver 118 are exposed to the process gas that is exhausted through the gas outlet tube 122, thereby undesirable thin film is deposited on or around the aforementioned parts. Later such undesirably deposited layer of thin film becomes not only the cause of undesirable micro-particles(contaminants) detrimental to the subsequent processing steps, but also the cause of potentially erratic operation of the parts inside the reaction chamber 114.

The second prior art shown in FIG. 1b, is to solve the problems in the first prior art shown in FIG. 1a as described above, and in FIG. 1b, the gas outlet tube 222 is positioned in the lower part of the middle of the reactor 200 so that the gas inlet tube 220 and the gas outlet tube 222 are arranged symmetrically. Specifically, referring to the schematic drawing of the second prior art as shown in FIG. 1b, unlike in FIG. 1a, the flow of process gas in the reaction chamber 214 is symmetric and even over the substrate 210, but the substrate carrier 216 and the substrate carrier drive 218 are still exposed to the process gas. Also, the volume of the reaction chamber can not be reduced significantly enough, in order to reduce the processing time for ALD processes. This is because the substrate carrier driver 218 still requires a certain minimum volume for moving the substrate carrier for normal operation of loading and unloading a substrate.

Figure 2:
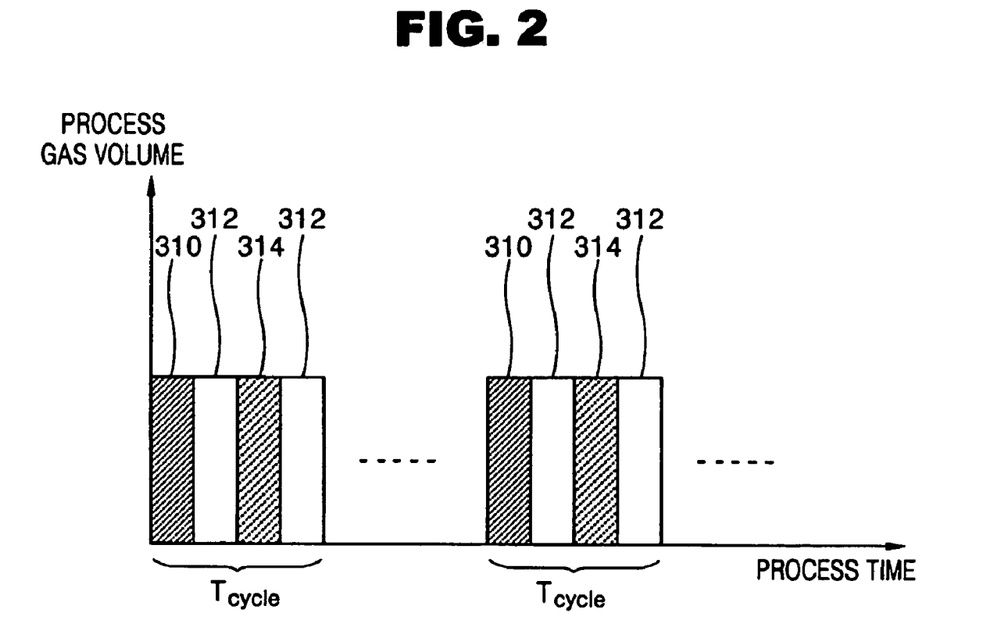
FIG. 2 is a timing diagram for a thin film formation process using a conventional chemical vapor deposition apparatus showing a sequence of the process gas supply and removal.

FIG. 2 is a timing sequence illustrating the process of conventional ALD process method. The vertical axis represents the process gas volume and the horizontal axis represents the processing time.

Referring to FIG. 2, the ALD process cycle is in the sequence of supply of first source gas 310→purge 312→supply of second source gas 314→purge 312. At the purge stage, the source gas supplied to the reaction chamber is removed either by evacuating the reaction chamber using a vacuum pump or by feeding an inert purge gas into the reaction chamber.

In the conventional ALD process, in case that the source gases react with each other easily, even a small amount of residual source gases may cause the undesirable generation of particles(contaminants), and therefore, it may be necessary to extend the time of purging. On the other hard, in case that the source gases react slowly, and as a result the processing time becomes longer, then the time for supplying the source gases may have to be lengthened, thereby the deposition time becomes longer.

Therefore, in order to solve these problems described above, the invertors of the present invention recently disclosed in KR0273473 a plasma enhanced atomic layer deposition method(PEALD), that improves the reactivity, reduces the purging time and thus improves the deposition rate, and as a result, improves the productivity of the deposition apparatus.

The difference between the plasma enhanced atomic layer deposition method and the aforementioned conventional ALD is a faster deposition rate even though source gases with low reactivity are used.

In the conventional ALD method aforementioned, when the source gases with low reaction rate are used, there is a slow reaction on the substrate, thereby, there may be a problem of lack of deposition of thin film.

However, the plasma enhanced atomic layer deposition method disclosed here increases the deposition reaction rate by generating radicals and ions with high reactivity by using a plasma, thereby these radicals and ions actively participate in the reaction process.

As an example of an apparatus that is suitable for processing using conventional ALD method, especially, the plasma enhanced ALD method has been disclosed in the patent application KR99-23078, "Chemical Deposition Reactor", which invention reduces the volume of the reaction chamber, provides a means of even flow of the source gases when these gases supplied, and removed through the gas inlet tube and the gas outlet tube, respectively, flows over the substrate, and provided a means of generating a plasma. However, when this apparatus is used for forming a conductive thin film, a plasma may not be generated because of the fact that two electrodes used for applying RF power for plasma generation are electrically shorted due to the formation of a conductive thin film, and therefore, a conductive thin film may not be formed by using this apparatus along with the plasma enhanced atomic layer deposition method disclosed in the present invention.

SUMMARY OF THE INVENTION

The object of the present invention is to construct a reactor within which the process gases are replaced in a short period of time in order to process atomic layer deposition method, and also within which a plasma is generated over the surface area of a substrate, thereby even if a conductive thin layers are deposited, without causing the aforementioned electrical short in the reactor, and at the same time the atomic layer deposition process can easily be carried out, and is to provide an apparatus for forming a high quality thin film by using the plasma enhanced atomic layer deposition method according to the present invention.

Another object of the present invention is to provide a method of forming efficiently a good quality of thin film, even if the source gases do not react with each other easily or the reactivity is very weak, by using a plasma enhanced atomic layer deposition apparatus according to the present invention.

According to the present invention, the plasma enhanced atomic layer deposition apparatus is equipped with a substrate carrier that supports a substrate, a reactor within which said substrate carrier is mounted, within this reactor a showerhead that supplies source gases uniformly on the surface of a substrate, gas inlet and outlet tubes that feeds and removes gases into and out of a reactor, and a plasma generating unit that accelerates thin film deposition process in the reactor into which this plasma generating unit is mounted. In addition, a process gas supply and purge system that supplies and removes process gases through a gas inlet and gas outlet tubes in a combination of time-divisional manner, is installed in the PEALD tool, and finally a controller that control and manages the entire system is also installed.

According to the present invention, more specifically, the process gas supply and removal system of the plasma enhanced atomic layer deposition apparatus makes it possible to supply (process gas inlet) and remove (process gas outlet) into and out of a reactor in short time interval in such a way that the gas supply and removal process take place in a fashion of a combination of time-divisional sequence, and also the controller of said apparatus controls the reactor, the plasma generation unit inside of the reactor, the process gas supply and removal system including a gas evacuation vacuum pump and the deposition chamber system (reactor system).

According to the present invention, a process gas inlet tube and a process gas outlet tube are installed symmetrically and concentrically with respect to substrate inside the reactor in order to supply and distribute the process gas uniformly over the substrate within the reaction space. To achieve this, the process gas inlet tube and the process gas outlet tube are placed centrally with respect to the substrate and in the peripheral area, respectively, in the reactor. In the embodiment described later, both gas inlet and gas outlet tubes are placed at the center of the upper part of the reactor and for this a set of concentrically structured two tubes is used. However, as an example, the process gas inlet tube may be placed around the peripheral area of the substrate. At the central location of the reactor, a showerhead is mounted for an even distribution of the process gas, and according to the present invention this showerhead has a shape of the open end of a horn. This horn-shaped showerhead can have many different shapes, for example, the edge of said horn may have an S-shape. However, the commonality in the horn-shaped showerhead is that the shape of the inner surface of the showerhead is streamlined-shape so that the process gas supplied though a gas inlet tube, the process gas is distributed evenly and uniformly along the inner surface of the showerhead. In the lower part of this showerhead, a grid with many holes or grids for dispersing a gas is mounted in parallel with the substrate. This grid disperses the process gas evenly and uniformly over the surface of the substrate.

The showerhead is horn-shaped for the reason of reducing the volume that the process gas occupies. Another reason for using a horn-shaped showerhead is to eliminate any corners inside the showerhead, in order to prevent the process gas from being trapped by and around these undesirable corners, thereby the flow of the process gas is curled around these corners, and as a result, these corners interfere with the uniform flow of the process gas. The horn-shaped showerhead helps the process gas flow uniformly, evenly and is smoothly.

According to the present invention, a volume adjusting horn and a gas dispersion perforated grid within the showerhead are the major parts forming a (+) electrode, the remaining metallic parts form a (−) electrode. Therefore, the plasma is generated only in the "reaction chamber" in the reaction space. In other words, the plasma is generated between the showerhead and the substrate carrier, and practically on the surface of the substrate.

The showerhead insulating wall made of non-conducting material of the shower head unit, and fixes the showerhead to the reactor. In order to prevent the formation of a conducting film on the surface of the showerhead, a barrier layer of plasma generation is provided between the insulating wall of the showerhead and the reactor wall. Formation of a conducting layer on the outer face of the insulating wall of the showerhead is prevented by blocking the flow of the process gas through the slits between the barrier layer of plasma generation and the insulating wall of the showerhead by continuously pushing an inert gas through said "slits" between said barrier layer of plasma generation and said insulating layer of said showerhead.

Radio frequency connection terminals are connected to the shower head for supplying RF (radio frequency) power to it.

Said radio frequency connection terminal is made of a tube-shaped metallic material and when desired RF power is supplied through terminal, an inert gas can be supplied through the space between the showerhead insulating wall and the barrier wall of plasma generation.

According to the present invention, the process gas inlet tube is connected to said showerhead through a micro-feeding tube assembly made of insulating materials. This micro-feeding tube assembly has more than one micro-tube in the middle of it, thereby said process gas is fed to the showerhead, but the plasma is blocked from reversed flow of reaction gas that may remain in the reactor or may be supplied to the reactor and also blocked from any leakage. The length of this micro-feed tube and the diameter of the micro-tuber are determined in such a way that the plasma does not leak.

According to the present invention, the substrate carrier is located in the lower part of the reactor and between the substrate carrier and the reactor wall there is a flat thin washer-like gas sealer ring for not only preventing the leakage or outflow of the process gas out of the reaction space, but also blocking the unnecessary film formation on the surface of the substrate carrier by blocking the contact of the process gas and the substrate carrier. Formation of unnecessary thin film does not occur even when the plasma is generated because the process gas does not contact with the substrate carrier. Also, according to the present invention, said gas sealer ring plays a key role of preventing the operational hindrance of the substrate carrier driver ever if the process gas is leaked into the external operational space of the substrate carrier, which space is filled with an inert gas such as Ar, thereby unnecessary metallic film is formed on the substrate carrier support and driver mechanisms.

According to the present invention, the substrate carrier is supported by a center support pin, center shaft, a plurality of driver shafts. Also, the substrate carrier moves up and down by a pneumatic cylinder linked to the driver shafts, thereby a substrate can be loaded onto and unloaded from the substrate carrier. Those parts described above are enclosed and sealed in the reactor body, and the operational space of the substrate carrier is filled with an inert gas such as Argon(Ar) so that it blocks any gas leaks as well as formation of unnecessary metallic film is blocked.

According to the present invention, as aforementioned, the reactor is enclosed by the reactor body an inert gas is fed through the inert gas inlet tube and is removed through the inert gas outlet tube, where the inert gas inlet and outlet tubes are installed in the reactor body. Here, the pneumatic cylinders are mounted outside of the reactor body.

According to the present invention, heaters are installed in the reactor walls and underneath the substrate carrier, thereby the substrate and the reactor body can be heated to a desired level, if necessary. The reactor body is electrically grounded, and through the driver shafts, the substrate carrier is also grounded. Also, the reactor walls are connected to the reactor body, and therefore, the reactor walls are electrically grounded.

According to another aspect of the present invention, a method of forming thin films by using plasma activation even when a source gas containing metallic elements does not react in a reactor, process gas includes this source gas(or deposition gas) and a purge gas, is disclosed. A substrate is loaded on the substrate carrier in a reactor.

Through a gas inlet tube, said source gas is fed into the reactor, supply of said deposition gas(or source gas) is ceased, and while said purge gas is fed into the reactor, plasma is generated in order to activate the film deposition reaction. According to the present invention, said method comprises the steps of feeding a source gas into a reactor, feeding a purge gas, generating plasma, and repeating said steps for a specified number of times in order to deposit a film to a desired thickness, thereby, forming a conducting layer of a thin film.

At the lower end of said gas inlet tube, micro-feeding tube assembly in which a plurality of fine and small micro-tubes are arranged in parallel, and said process gases are fed through said gas inlet tube and then through said micro-feeding tube assembly and finally into the showerhead assembly area inside the reactor.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The detailed description of the present invention aforedescribed, will become clear through this Best Mode for Carrying Out the Invention.

Figure 3:
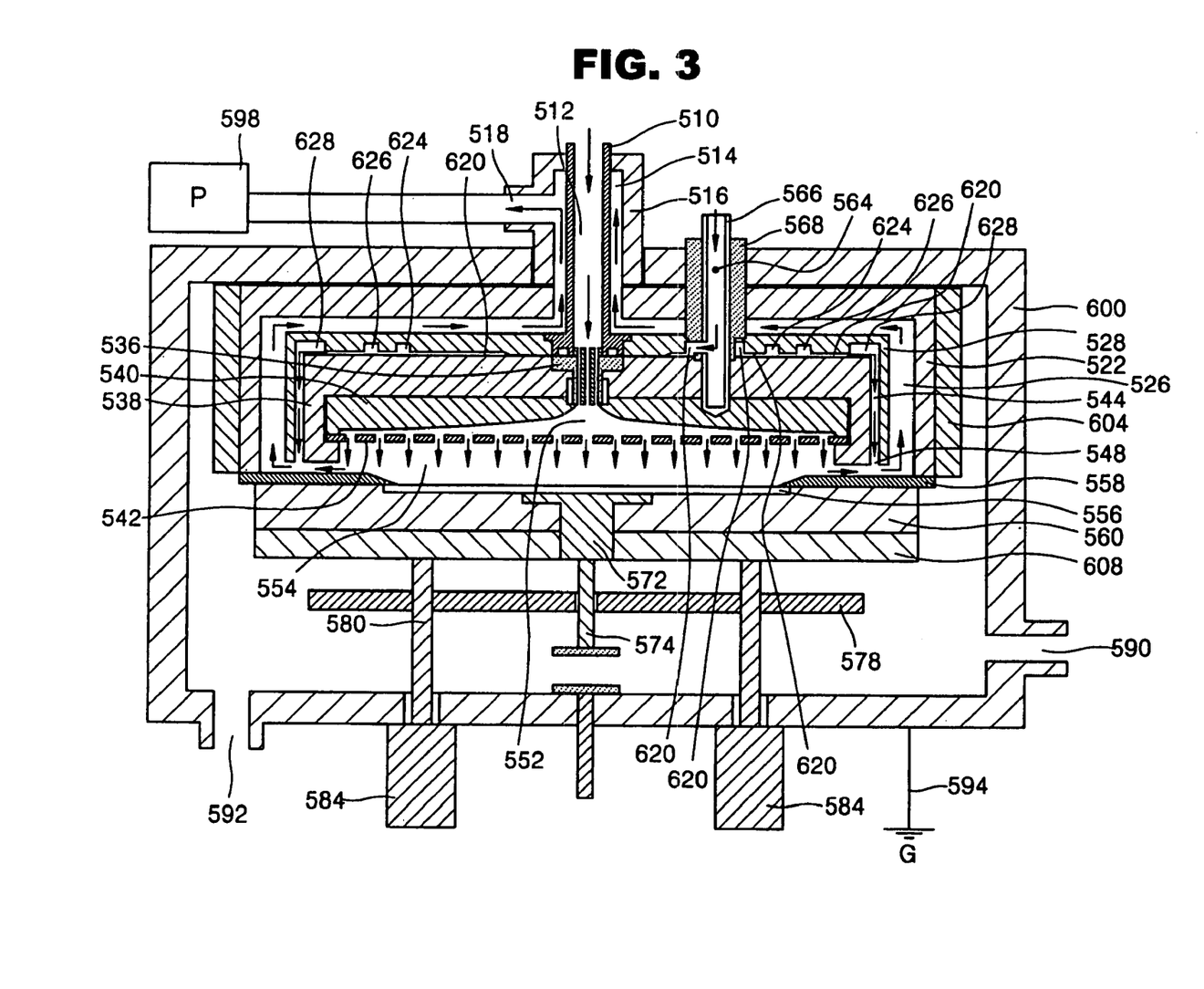
FIG. 3 is a schematic drawing of the cross-section of plasma enhanced atomic layer deposition apparatus according to the present invention

FIG. 3 is a cross-sectional schematic diagram of a plasma enhanced atomic layer deposition apparatus according to the Best Mode of the present invention.

Referring to FIG. 3, a heater is installed at the bottom part of the substrate carrier 560 so that it can control the temperature of the substrate 556 or the reaction space 554 as necessary. In addition, a heater 604 installed on the reactor walls 522 may be if necessary used for increasing the temperature of the reactor which is the inside of the reactor wall.

At the upper part of the reactor wall 522 made of an alloy, a dual orifice tube assembly 516 and at the lower part of the reactor wall 522, there is a substrate carrier 560. The substrate carrier 560 and the reactor wall 522 define the inner part of the reactor. A gas sealer ring 558 is located between the top surface of the outer ring of the substrate carrier 560 and the bottom end of the reactor wall 522, and this gas sealer ring 558 shaped as a thin flat washer-like with an inner side hovelled and outer side-square edged ring seals between the substrate carrier 560 and the reactor wall 522 as well as covers the top surface of the outer ring area of the substrate carrier 560. This gas sealer ring 558 prevents the process gas from leaking as well as protects the substrate carrier 560 from being exposed to process gases. The gas inlet tube 510 is mounted as a part of dual orifice tube assembly 516 in the upper part of the reactor wall 522. The process gas travels in the direction of arrows through the micro-feeding tube assembly 536 and then into the inner part 552 of the showerhead assembly. The outer tube 514 of the dual orifice tube assembly 516 is a passage way of flowing for the process gas, and the inner tube 510 of the dual orifice tube assembly 516, in other words, the gas inlet tube 510 is the inlet entrance for the process gas. The process 552 gas flows in the direction of indicated by arrows inside of the inner tube 510.

The showerhead assembly (540, 542) comprises a volume adjusting horn 540 and a gas dispersion perforated grid 542. The shape of the volume adjusting horn 540 allows the process gas to distribute uniformly, evenly and smoothly over the substrate 556, and at the same time, minimizes the volume of the inner part of the showerhead 552. More specifically, the reason for making the shape of the showerhead 540 as on open end of a horn is to reduce the volume of the inner part of the showerhead 552, and such a shape reduces the curling effect of the process gas flow, and thereby the process gas is distributed uniformly and evenly, otherwise any corners that may exist in the inner part of the showerhead 552 would cause trapping of the process gas and, thereby around these corners curling phenomenon may occur.

Furthermore, the shape of a horn itself makes the flow of the process gas even and uniform. At the bottom part of the volume adjusting horn 540, a gas dispersion perforated grid 542 is mounted and this makes the flow of the process gas even more uniform, thereby it allows the process gas to he distributed uniformly over the top surface of a substrate 556. The showerhead assembly (540, 542) and the bottom end of the gas inlet tube 510 are connected through a micro-feeding tube assembly 536, and therefore, the process gas enters into the gas inlet tube 510 and flows in the direction of arrows indicated, and continue to flow through the micro-feeding tube assembly 536 and then to the inner part 552 of the showerhead assembly.

As described above, the shape of the volume adjusting horn 540 is designed to minimize its volume for proper processing of a substrate, and yet to let a process gas to flow smoothly and evenly over a substrate 556 as well as to make the removal of a process gas and filling a incoming process gas easily and fast. More specifically, during a sequential supply of process gases, the possibility of the vapor state reaction between a new process gas and the residual gas of the previous supply cycle accumulated and remained unnecessarily in the inner part of the showerhead 552. The dual orifice tube assembly 516 is, as described previously, connected to the inlet opening of the reactor wall 522 and the outer tube of the dual orifice tube assembly 516 is connected to a vacuum pump 598 through a gas outlet tube 518. Therefore, the process gas entered into the reaction space 554 by being dispersed evenly through the gas dispersion perforated grid(or showerhead grid) 542 travels through the gap 526 (passage of removal gas indicated by arrows) between the reactor wall 522 and the plasma generation barrier 528, and then through the gas outlet tube 518, and then finally to the vacuum pump 598.

In FIG. 3, the arrows indicate the direction of the flow of a process gas. The reactor wall 522 may be heated by using a heater 604 as necessary. The radio frequency connection terminal 566 is made of a metallic tube for receiving a radio frequency power from outside and an insulation tube 568 made of an insulating material, and this terminal 566 is connected electrically to both volume adjusting horn 540 and the gas dispersion perforated grid 542 as a plus (+) polarity. The radio frequency connection terminal 566, shielded with an insulating tube 568 is connected to the volume adjusting horn 540 through the reactor body 600, the reactor wall 522, the plasma generation barrier 528 and the showerhead insulation wall 538. Because of the insulating tube 568, the radio frequency connection terminal 566 is electrically insulated form the reactor body 600, reactor wall 522 and the plasma generation barrier wall 528, whereas the radio frequency connection terminal 566 which is a conductor, is electrically connected only to the volume adjusting horn 540.

On the other hand, the showerhead insulating wall 538 is electrically insulated from the radio frequency terminal 566 because the showerhead insulating wall 538 is made of an insulating material.

On the other hand, the gas inlet tube 510(on an inner tube) is a conductor, and because the micro-feeding tube assembly 536 is made of an insulating material, the showerhead assembly 540, 542 is electrically insulated from the reactor wall 522 as well as the reactor body 600. And the substrate 556 as well as the substrate carrier 560 is electrically connected to ground 594 through the driver shaft 580 and the reactor body 600. Therefore, when radio frequency power is applied by using an RF generator (not shown), plasma is generated between the showerhead assembly 540, 542 as a positive (+) polarity and the substrate 556 as well as the substrate carrier 560 as a negative (−) polarity. Then, a thin film is formed on the substrate 556 due to the source gas used and activated by the plasma generated. Here, the plasma is generated only in the reaction space 554 between the gas dispersion perforated grid 542 and the substrate 556 as well as the substrate carrier 560. According to the present invention, the plasma generation barrier wall 528 is installed between the showerhead insulation wall 538 and the reactor wall 522 in order to prevent any electrical short between the showerhead assembly 540, 542 and any metallic part within the reactor such as the reactor wall 522 due to a formation of a conductive thin film on the surface of the showerhead insulation wall 538 which is used for mounting the showerhead assembly 540, 542 to the reactor body 600. Here, there are two key aspects of installing a plasma generation barrier wall 528. First, the plasma generation barrier wall 528 is electrically connected to ground 594 through the gas inlet tube 510 and the reactor body 600. Therefore, plasma is not generated in the passage of removal gas 526 between the plasma generation barrier wall 528 and the reactor wall 522, thereby a conductive thin film is not formed, and therefore, this passage 526 is used as a passage for process gases. Second, the passage of inert gas 544 between the showerhead insulation wall 538 and the plasma generation barrier wall 528 allows plasma to generate even if in the lower tip end part of the showerhead insulation wall 538 near the substrate carrier 560 has a conductive thin film is formed, and also by supplying an inert gas continuously through the narrow passage of inert gas 544, plasma generation near the end part of the passage of inert gas 544, and formation of a conductive thin film is blocked, and thereby, this prevents an electrical short between the showerhead assembly 540, 542 and ground 594 from occurring.

As described above, by supplying an inert gas such as Argon(Ar) through the inner tube 564 of the radio frequency connection terminal 566 and then through the narrow passage of inert gas 544 between the showerhead insulation wall 538 and the plasma generation barrier wall 528, and as the inert gas continue to flow, as indicated by arrows, through the gap between the showerhead insulation wall 538 and the plasma generation barrier wall 528 and then around the end part of the passage of inert gas 544 and then continues to flow through the gap between the plasma generation barrier wall 528 and the reactor wall 522, and then eventually the inert gas travels through the gas outlet tube 518 and is then exhausted through the vacuum pump 598. This inert gas is supplied continuously even during the thin film deposition process, period thereby formation of a conductive thin film on the surface of the showerhead insulation wall 538 is prevented by blocking the exposure of the top and side parts of the showerhead insulation wall 538 to process gas.

On the other hand, by constructing the micro-feeding tube assembly 536 with a plural of small and fine tubes with small in diameter, a plasma generation inside the micro-feeding tube assembly 536, thereby formation of a thin conductive film inside of the micro-feeding tube assembly 536 is prevented.

According to the present invention, the invention comprises four(4) significant inventive parts. First one is the shape of the volume adjusting horn 540 of the showerhead assembly 540, 542, the second is the structure of the micro-feeding tube assembly 536, the third is the arrangement of a thin gap provided between the showerhead insulation wall 538 so that an inert gas such as Argon(Ar) is continuously supplied, and the fourth is an efficient way of structuring a plasma generation unit by arranging and using a radio frequency power connection terminal 566 made of a conducting tube and an insulating tube 568 made of an electrically insulating material.

On the other hand, since it is possible that plasma generation may take place due to the potential difference between the gas inlet tube 510 and the showerhead assembly (540, 542), this undesirable presence of plasma might cause formation of conductive thin film on the inner surface of the part where the showerhead insulation wall 538 and the showerhead assembly 540, 542 are connected (This is the part where the micro-feeding tube assembly 536 is located), thereby, the conductive thin film formed around the centrally located hole in the middle of the showerhead insulation wall 538 may cause on electrical short between the showerhead assembly 540, 542 and the gas inlet tube 510. Therefore, in order to suppress undesired plasma generation in the neighborhood of the aforementioned micro-feeding tube assembly 536, said micro-feeding tube assembly 536 structured with a plural of tubes with small in diameter, in parallel, is assembled to connect the showerhead assembly 540, 542 and the gas inlet tube so that the micro-feeding tube assembly 536 suppresses the plasma generation while the inert gas flows steadily. Aforementioned micro-feeding tube assembly 536 is made of insulating materials. The size of the diameter of the small tubes in the micro-feeding tube assembly 536 is chosen in such a way that the size is small enough so that plasma generation does not occur, yet an adequate amount of gas flows through steadily. In the present best mode for the present invention, it was found adequate that the over-all diameter of the micro-feeding tube assembly is about 6 mm and its length is about 20 mm and the diameter of the small tubes is about 0.6 mm and eight(8) of them altogether are used to construct a micro-feeding tube assembly 536.

Instead of using a micro-feeding tube assembly 536 made of insulating material, for connecting the gas inlet tube 510 and the showerhead assembly 540, 542, a set of long tubes sufficiently longer than the distance between the gas dispersion perforated grid 542 and the substrate 556 so that the occurrence of plasma generation inside these tubes may be prevented. However, to do this, the upper part of the thickness of the showerhead insulation wall 538 must be made thicker in order to accommodate the extra length of the gas dispersing perforated grid 542 as well as other parts of the reactor assembly must be significantly enlarged, thereby the cost and material for constructing such a part increases.

In a small space, the frequency of collisions between the electrons and gas atoms or molecules while the electrons moving towards electrodes often being accelerated due to the electric and magnetic fields. In order to maintain the state of plasma, the electrons sufficiently accelerated in a given electric and magnetic fields collide with the neutral gas particles and such collisions ionize the atoms and molecules, thereby release the electrons bound in such atoms and molecules, and in turn, these electrons are sufficiently accelerated by the fields, and then collide with other neutral gas particles, thereby release the electrons found in other atoms and molecules, and this process must repeat by itself, again, in order for the state of plasma to be maintained. However, in general, in a small space the electrons collide with solids and loose their energy before such electrons gain sufficient energy for releasing other electrons from neutral gas particles, thereby the process of ionizing the neutral gas particle does not progress efficiently, and as a result, the plasma generation process is suppressed in a small space.

Furthermore, referring to FIG. 3, a potential difference between the reactor wall 522 and the showerhead insulation wall 538 may exist and therefore a plasma state may be generated here, and as a result, on the inside surface of the reactor wall 522 and the outside surface of the showerhead insulation wall 538, a conducting thin film may be formed due to the reaction of the process gas occurring while such process gas is passing through the reactor space 554, the reactor wall 552, and then the showerhead insulation wall 538. The conducting thin film formed on the outer surface of the showerhead insulation wall 538 may cause an electrical short between the showerhead assembly 540, 542 and the reactor wall 522, which is connected to ground.

In order to remedy the problem described above, according to the present invention, a plasma generation barrier wall 528 is constructed between the reactor wall 522 and the showerhead insulation wall 538, and also connect electrically with the reactor wall 522 through the gas inlet tube 510(inner tube), the plasma generation does not take place due to the fact that there is no potential difference between the plasma generation barrier wall 528 and the reactor wall 522. If the distance(space) between the plasma generation barrier wall 528 and the showerhead insulation wall 538 is reduced, the plasma generation in this neighborhood can be suppressed. In this case, the plasma generation takes place mainly in the relatively spacious reaction space 554 between the gas dispersion perforated grid 542 and the substrate 556 where the showerhead assembly 540, 542 to which radio frequency power is applied with respect to grounded. Also, by supplying an inert gas such as Argon(Ar) continuously during the film formation period through the gaps 544, 548, 526 between the plasma generation barrier wall 528 and the showerhead insulation wall 538 in the direction of arrows, undesired flow of process gases through the end part of the passage of inert gas 548 as well as the passage of inert gas 544 can be prevented. The necessary inert gas for above step is supplied through a tube-shaped radio frequency power connection terminal 566. The inert gas is supplied through the hole at the center of the radio frequency power connection terminal 566 and then through the hole 564 in the tube, and then through the gaps between the showerhead insulation wall 538 and the plasma generation barrier wall 528 as indicated by arrows. The inert gas then travels the gaps and passage ways 620, 624, 626, 628 and to the passage of inert gas 544 and then continue to flow following the arrows. Here, it is desirable to provide a set of passage ways and buffering spaces such as 620, 624, 626 and 628 for proper flow of an inert gas. Also, such passage ways and buffering spaces are preferably arranged so that a proper, adequate, and smooth flow of the inert gas is achieved. Such arrangement preferably provides a uniform and even flow of the inert gas through out the inert gas passage ways as indicated by arrows even if the location of the radio frequency connection terminal 566 is located off centered, as shown in the FIG. 3. According to the best mode of the present invention, for the gap size of the passage of inert gas 544 is 0.4 mm and the gap size of the end part of the passage of inert gas 548 is 0.4 mm, respectively, and the outside diameter of the showerhead insulation wall 538 is 210 mm for the 200 mm wafer, and a gas is supplied at the flow rate of 20 sccm, the flow velocity of the gas at the gaps of the passage of inert gas 544 and the end part of the passage of inert gas 548, respectively, is 19 mm/s at the temperature of 25° C. and the pressure of 5 Torr. As the temperature increases, the flow velocity increases.

More specifically, referring to FIG. 3, When a inert gas such as Argon(Ar) is supplied by using an MFC(Mass flow controller)(not shown) through the inert gas inlet tube 566 which is called the radio frequency connection terminal 566 previously, where ibis terminal 566 is made of a conducting material, the inert gas is forcibly supplied through the inert gas inlet tube 566 and flows, as indicated by arrows, through the first reservoir ring 620, the inert gas passage way 622, the second reservoir ring 624, the third reservoir ring 626 and the fourth reservoir ring 628, and then through the passage of inert gas which is the gap between the showerhead insulation wall 538 and the plasma generation barrier wall 528, and then continue to flow following the arrows, and eventually flows through the end part of the passage of inert gas 548 which is the bottom part of the showerhead insulation wall 538 and the plasma generation barrier wall 528, respectively, and finally joins with the process gas and this mixed gas flows through the passage of removal gas 526 which is the gap between the plasma generation barrier wall 528 and the reactor wall 522, and follow the direction of flow and then through the gas outlet tube 518, and then exhausted by the vacuum pump 598.

During this gas flow process, the flow of the inert gas through the end part of the passage of inert gas 548 blocks backflow of the process gas inside of the reaction space 554 flowing through the gap of the passage of inert gas 544 which is the gap between the showerhead insulation wall 538 and the plasma generation barrier wall 528 and flowing backwards against the flow of inert gas into the passage of inert gas 544, and therefore, when a process gas containing metallic material is used, no undesirable conducting thin film is formed inside of the passage of inert gas 544, particularly around the end part of the passage of inert gas 548, and as a result, it does not create a problem of an electrical short. This prolongs the life of the usage of the surrounding areas of the reaction space 554.

A conducting thin film is formed only in the areas where a process gas is supplied and present and the plasma generation occurs. This means that no conductive thin film is formed between the plasma generation barrier wall 528 and the reactor wall 522 because no plasma is generated, and that no conductive thin film is formed between the plasma generation barrier wall 528 and the showerhead insulation wall 538 because no process gas is supplied and present. Consequently, a conducting thin film is formed only within the reaction space 554, where a substrate 556 is located and no conducting thin film is formed outside the reaction space 544, and therefore, an electrical short is blocked even if the process of formation of a conducting thin film is repeated.

According to the present invention, a reactor body 600 includes the reactor wall 522 along with the elements installed inside including a substrate carries 560, an inert gas inlet tube 590 and an inert gas outlet tube 592 equipped with an on-off valves for gases, respectively, where the exact location of these gas inlet and outlet tubes is not significant.

The purpose of using this secondary inert gas covering most of the reactor parts is to reduce the gas leakage by maintaining the pressure level of the secondary inert gas as such. More will be described later. The radio frequency connection terminal 566 is connected to the showerhead assembly 540,542 though the reactor body 600 as well as the reactor wall 522, and this installation process provides electrical insulation of the radio frequency connection terminal from the reactor body 600 as well as the reactor wall 522. Furthermore, according to the present invention of the plasma enhanced atomic layer deposition apparatus, when a showerhead insulation wall 538 and a plasma generation barrier wall 528 are constructed, a radio frequency connection terminal 566 is connected to a showerhead assembly 540, 542 through a reactor body 600, a reactor wall 522, a plasma generation barrier wall 528 and then a showerhead insulation wall 538, and the connections are made with the reactor body 600, the reactor wall 522 and the plasma generation barrier wall 528 in such a way that the radio frequency connection terminal is electrically insulated from the parts described above. The reactor body 600 has mainly two parts of a top cover and the bottom body. As described above, leakage of inside of the reaction space 554 can be prevented by maintaining the pressure of the inert gas that is supplied through the inert gas inlet tube 590 and then out through the inert gas outlet tube 592 higher than the pressure of the gas inside of the reaction space 554.

The substrate carrier driven assembly for driving a substrate carrier 560 consists of primarily pneumatic cylinders 584, a drive shaft 580 that connects the pneumatic cylinder 584 and a substrate carrier 560, and a girding plate 578 that maintains a balance among the drive shafts 580. When a substrate is loaded and unloaded on or from the substrate carrier 560, the substrate carrier connected to an pneumatic cylinder 584 moves downwards, so that the reactor wall 522 and the substrate carrier 560 are separated and the reaction space 554 is opened. This time, the center support pin 572 is connected to the center axis stopper pin 574, and this stopper pin 574 stops the downward movement at a given height. As the substrate 556 continues moving downward further, the substrate carrier is separated from the substrate 556 since it is supported by the center support pin 572 and stops by the center support stopper pin 574, but the substrate carrier 560 continues to move downwards as the pneumatic cylinders 584 pulls the substrate carrier 560 further down. The substrate 556 stops at a given height so that a robot arm (not shown) is able to load or unload the substrate 556. The lengths of the center support stopper pin 574 and the center support pin 572 are adjusted as necessary in order to accommodate the movements of a robot arm(not shown).

According to the present invention of the plasma enhanced atomic layer deposition apparatus, the volume adjusting horn 540 that has a shape of a horn makes the flow of the process gas smooth and evenly distributed, while the volume of the inside of the showerhead is minimized and thus the exchange of the process gases are done easily and quickly, thereby potentially the unnecessary reaction between the residual gas remained inside of the showerhead assembly 540, 542 from previous process cycle and the subsequently supplied gas is minimized. Also, by using a micro-feeding tube assembly 536 made of a plural of small tubes in parallel, the plasma generation between the showerhead assembly 540, 542 and the process gas inlet tube 510 can be suppressed, and also, by supplying an inert gas through the passage of inert gas between the grounded plasma generation barrier wall 528 and the showerhead insulation wall 538, a thin film is formed only in the reaction space 554 between the gas dispersion perforated grid 542 and a substrate 556, but no thin film is formed on other parts where a process gas flows, thereby a conducting thin film can be formed by using the plasma enhanced atomic layer deposition method without a problem of having electrical shorts. Furthermore, the process gas flows within the inside of the reactor, and does not contact with the reactor body 600.

Figure 4:
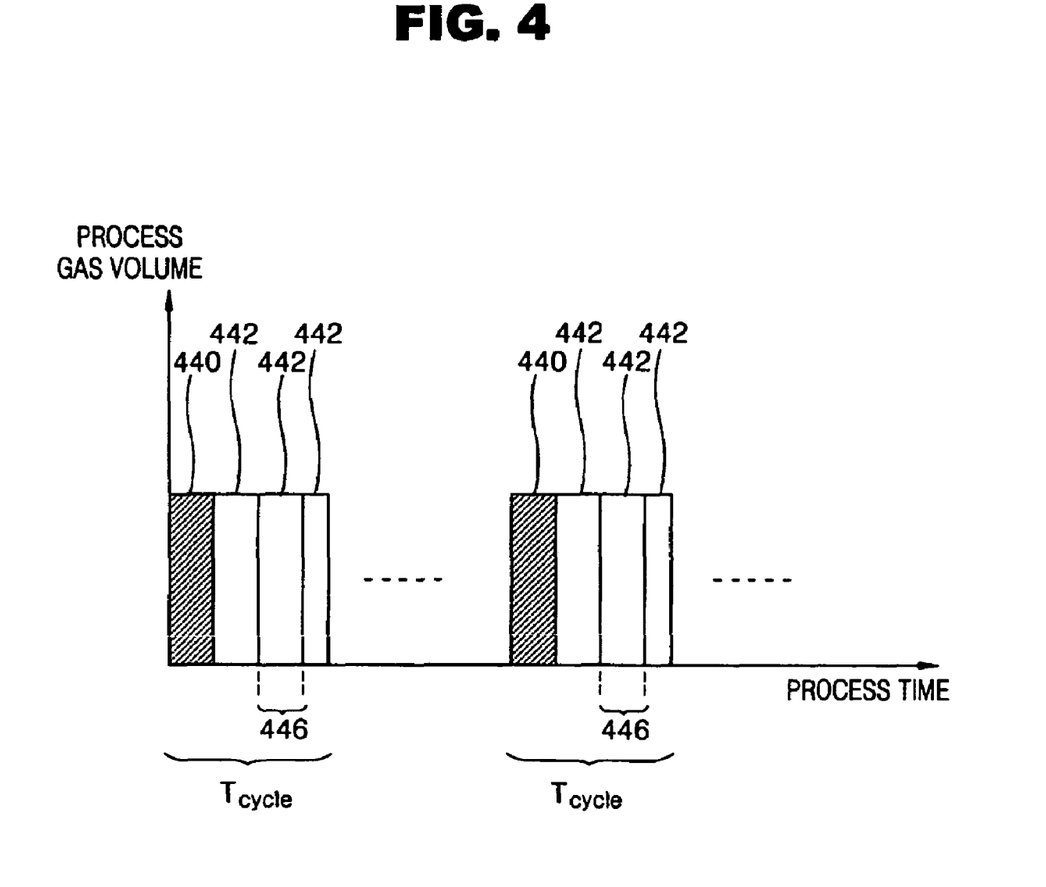
FIG. 4 is a timing diagram for a thin film formation process using an plasma enhanced vapor deposition apparatus according to the present invention showing a sequence of the process gas supply and removal as well as the plasma generation.

FIG. 4 is a timing diagram related to the best mode described above by using a plasma enhanced atomic layer deposition for illustration.

Referring to FIG. 4, the source gas 440 and the purge gas 442 are supplied in a cycle of Tcycle in a sequence of 440→442. Here, during the purge gas 442 supply cycle, plasma generation 446 occurs for a specified duration of time by applying a radio frequency power 446. A source gas 440 includes a metallic element such as Titanium Tetra Chloride(TiCl$_4$) that is used for forming a metallic thin film, and the purge gas 442 is a gas that does not react with a deposition gas by simply mixing them, but, they reacts when activated by a plasma 446.

Figure 5:
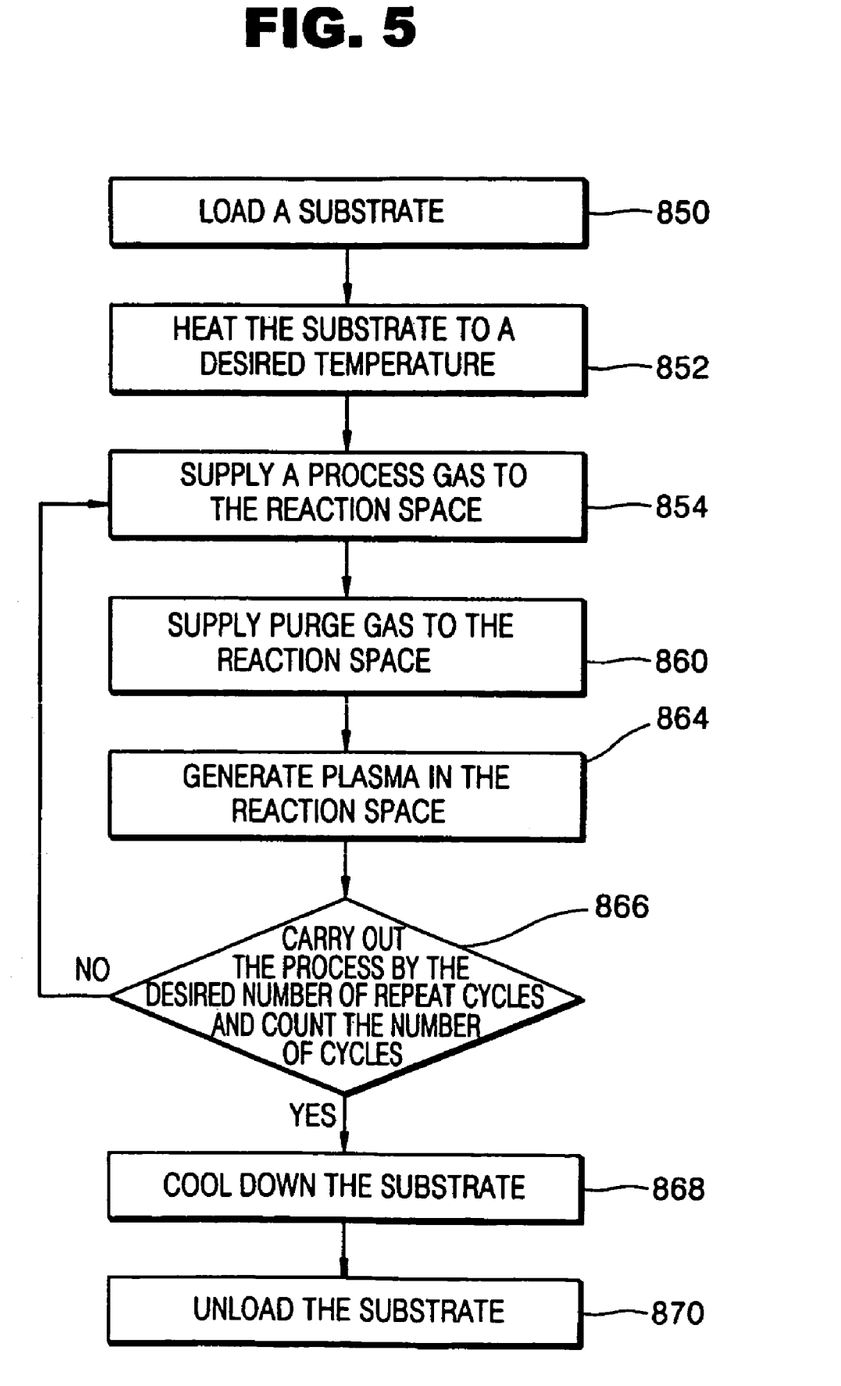
FIG. 5 is a flow chart for the process of forming a conducting thin film by using a plasma enhanced atomic layer deposition apparatus according to the present invention, showing the sequence of process gas supply and removal as well as plasma generation.

FIG. 5 is a flowchart of typical process steps using a plasma enhanced atomic layer deposition apparatus according to the present invention.

Referring to FIG. 5, a substrate 556 is loaded onto a substrate carrier 560.(step 850). The temperature of the substrate 556 is raised to a desired deposition temperature. (step 852). A source gas 440 is supplied to a reaction space 554.(step 854) A purge gas 442 is supplied to the reaction space 554 and remove the remaining deposition gas 440. (step 860) through the radio frequency power connection terminal 566, RF power is supplied and plasma 446 is generated in the reaction space 554 and the purge gas 442 mixed with source gas is activated.(step 864). The plasma 446 activates the deposition gas(source) 440 adsorbed on the surface of the substrate 556 and a thin film is formed. Then, the RF power is switched off. Once The RF power is disconnected, the density of the radicals and ions in the activated purge gas is decreased drastically, thereby the time required to feed the purge gas after the RF power is switched off can he reduced significantly.

This process step is repeated by the specified number of times until the thin film is formed to a desired thickness.(step 866 and repeat of steps 854 through 866 as necessary). Once the deposition process is completed, the substrate 556 is cooled down (step 868), and the substrate 556 is unloaded from the reaction space 554. (step 870).

According to the present invention, a thin film can be formed using only two types of gases by means of atomic layer deposition method, and this process makes the process gas supply and distribution system simple as well as the deposition process cycle time(Tcycle) can be reduced. Furthermore, according to the method of the present invention, even if source gas 440 and the purge gas 442 may be mixed in the areas of reaction space 554, the gas inlet tube 510, the gas outlet tube 518 and also near the gas exhaust area, the reaction does not take place, thereby undesirable particles are not generated.

[Experimental Embodiment 1]

Following the best mode for carrying out the present invention described above, a thin film using Titanium Nitride(TiN) is formed by the conducting thin film formation method in accordance with the present invention of the plasma enhanced atomic layer deposition method. For this experimental, embodiment, to supply a source gas, 160 sccm of Argon(Ar) gas and Titanium Tetra-Chloride(TiCl$_4$) carried by Argon(Ar) gas of 100 sccm which passes through a source container were supplied through the shower head 540 in a reactor loaded with a substrate. For the process of supplying a purge gas, 100 sccm of Hydrogen(H$_2$) gas, 60 sccm of Nitrogen(N$_2$) gas and Argon gas of 100 sccm were fed through the reactor. Through the orifice of the radio frequency power connection terminal 566, 20 sccm of Argon gas was supplied continuously. The substrate temperature was set at 350° C., the RF power was set at 150 W, and the pressure was set at 3 Torr. The duration of the source gas supply was 0.2 second and the duration of the purge gas supply was 5.8 seconds. During the period of 5.8 seconds, for the first 2.0 seconds, the RF power was in the off-state, and only the purge gas was supplied. During the next 2.0 seconds, the purge gas was supplied and at the same time the RF power was switched on to generate plasma. During the last 1.8 seconds, the RF power was switched off and at the same time only the purge gas was supplied. By repeating this 6.0 seconds cycle, a uniform quality of Titanium Nitride thin film was obtained.

[Experimental Embodiment 2]

By using the plasma enhanced atomic layer deposition method according to the present invention, a conductive thin film of Titanium was formed. Similarly to Experimental Embodiment 1 described above, for the source gas supply step, 230 sccm of Argon gas and TiCl$_4$(Titanium Tetra-Chloride) carried by Argon gas of 100 sccm which passes through a source container was supplied to the shower head assembly 540, 542. For the purge gas supply step, 100 sccm of Hydrogen(H$_2$) gas and 230 sccm of Argon gas were supplied. Through the orifice of the radio frequency connection terminal, 20 sccm of Argon gas was supplied. The substrate temperature was set at 380° C., the RF power was set at 200 W and the pressure was set at 3 Torr. The duration of the source gas supply was 0.2 second, the purge gas was supplied for 5.8 seconds. During the purge gas supply time of 5.8 seconds, for the first 2.0 seconds, the RF power was switched off and only the purge gas was supplied. For the next 2.0 seconds, the purge gas was supplied and also the RF power was turned on to generate plasma.

By repeating these 6.0 seconds of process gas supply cycles, a Titanium thin film of uniform quality was obtained.

As described earlier, according to the present invention of the plasma enhanced atomic layer deposition apparatus, the horn-shaped volume adjusting horn allows a uniform distribution and even flow of the gases, and at the same time, this shape minimizes the volume of the inside of the showerhead, thereby it makes the exchange of gases in the reactor easy and fast, and thus the reaction between the incoming gas into the reactor and the residual gas remaining from the previous process cycle is minimized due to the fact that a smooth horn-shaped showerhead minimizes the amount of unnecessary residual gas staying is the reactor after the pervious gas supply cycle. Also, the micro-feeding tube assembly made of a plural of small tubes in parallel, potentially, suppresses the plasma generation due to the potential difference between the showerhead assembly and the gas inlet tube. In addition, the forced flow of an inert gas through the gap between the plasma generation barrier wall and the showerhead insulation wall, makes the formation of thin film occur only inside of the reaction space which is the space between the gas dispersion perforated grid and the substrate, and since thin film is not formed on other parts even though a process gas flows, no electrical short takes place and a conducting thin film can be formed by using the plasma enhanced atomic layer deposition method according to the present invention. Therefore, since plasma is generated only in the reaction space between the gas dispersion perforated grid and the substrate, and on the other parts where the process gas flows, the deposition of thin film is suppressed, the plasma enhanced atomic layer deposition method according to the present invention can be used for forming conducting thin films.

Furthermore, by utilizing a dual orifice tube structure for the gas inlet tube and gas outlet tube, any biased flow of the process gases towards the location of gas outlet tube inside the reaction space, can be avoided, and the flow of process gases flows symmetrically and balanced way in the reaction space, thereby uniform deposition of thin film is possible. Also, since the flow of the process gases can be maintained symmetrically and concentrically with respect to the substrate, the showerhead assembly and the reaction space can be constructed within a smaller volume. Therefore, for the process of sequentially supplying various types of process gases, the exchange of gases becomes easy and fast.

Further, by employing a doubly wrapped reactor chamber body structure, thereby the process gas flows only within the inner chamber and an inert gas flows through the outer chamber, the lower part of the substrate carrier is prevented from unnecessary thin film being deposited.

Also, according to the present invention of the plasma enhanced atomic layer deposition method allows an efficient ways of forming thin film even when the process gases have vary weak reaction property. Furthermore, by using the ALD method disclosed here, within the process cycle, the purge gas supply time can be minimized, and thereby the over-all process time can be shortened. Further, according to the present invention, generation of undesirable particles at the exhaust end of the reactor assembly can be reduced.

The present invention described in this best mode for carrying out the present invention is not limited by what is described and disclosed in this best mode section and elsewhere in this invention. Those who are familiar in the art should be easily able to extend the ideas and ways of implementing the present invention, and many variations are plausible within the scope of the technical ideas and understandings.

What is claimed is:

1. A plasma enhanced atomic layer deposition (PEALD) apparatus for depositing a thin film on a substrate, the apparatus comprising:
    a substrate carrier for supporting a substrate;
    a reactor wall defining the interior of a reactor together with said substrate carrier and said reactor wall having an opening at the top thereof;
    a gas inlet tube for supplying a gas into said reactor;
    a showerhead assembly to which said gas inlet tube is connected and installed within said reactor wall and defining a reaction space together with said substrate carrier and said showerhead assembly for supplying a gas to said reaction space;
    a micro-feeding tube assembly made of insulating materials mounted between said gas inlet tube and the showerhead assembly for preventing generation of plasma due to potential difference between said gas inlet tube and the showerhead assembly while maintaining flow of gas supplied through said gas inlet tube, the micro feeding tube having a plurality of small tubes mounted in parallel, the plurality of small tubes configured to suppress plasma generation therein;
    a gas outlet tube for discharging a gas from the reaction space; and
    a radio frequency (RF) connection terminal for generating plasma.

2. The apparatus of claim 1, wherein the plurality of tubes in the micro-feeding tube assembly each have a diameter and a length small enough to prevent generation of plasma.

3. The apparatus of claim 1, wherein the gas inlet tube is inserted into the opening at the top of the reactor wall with a diameter less than the opening of the reactor wall, and the gas outlet tube is installed in the opening so that the gas supplied to the reaction space passes through a space between the reactor wall and the showerhead assembly and is discharged through a gap between the reactor wall and the gas inlet tube.

4. The apparatus of claim 1, wherein the RF connection terminal is connected to the showerhead assembly through the reactor wall, and is electrically insulated form the reactor wall.

5. The apparatus of claim 1, further comprising a reactor body having a gas inlet port and a gas outlet port that can open and shut, the reactor body forming an outer wall surrounding a predetermined region of the reactor wall and the substrate support.

6. The apparatus of claim 5, wherein the RF connection terminal is connected to the showerhead assembly through the reactor body and the reactor wall in order to apply RF power, and is electrically insulated from the reactor body and the reactor wall.

7. The apparatus of claim 1, further comprising a gas sealer ring covering the substrate carrier and connecting to the reactor wall in order to provide sealing of the inner part of the reactor.

8. The apparatus of claim 1, further comprising a heater installed to surround the sidewall of the reactor wall.

9. The apparatus of claim 1, further comprising a heater installed underneath of the substrate carrier for heating the substrate.

10. The apparatus of claim 1, wherein the substrate carrier moves up and down so that the substrate is loaded into or unloaded from the reaction space.

11. A plasma enhanced atomic layer deposition (PEALD) apparatus for depositing a thin film on a substrate, the apparatus comprising:
    a substrate carrier for supporting the substrate;
    a reactor wall defining the interior of the reactor together with the substrate carrier and the reactor wall having an opening at the top thereof;
    a gas inlet tube for supplying a gas into the reactor;
    a showerhead assembly to which the gas inlet tube is connected and is installed within the reactor wall for defining a reaction space together with the substrate carrier and the showerhead assembly for supplying a gas to the reaction space;
    a showerhead insulating wall surrounding the top part and the sides of the showerhead assembly;
    a plasma generation barrier wall installed between the showerhead insulating wall and the reactor wall and having the same potential as the reactor wall, plasma generation barrier wall having a gap to the showerhead insulating wall;
    a gas outlet tube for discharging a gas from the reaction space; and
    a radio frequency (RF) connection terminal connected to the showerhead in order to apply an RF power.

12. The apparatus of claim 11, wherein an inert gas is forced to flow through the gap between the plasma generation barrier wall and the showerhead insulating wall, thereby blocking the gas supplied to the reaction space from being flown into the gap between the plasma generation barrier wall and the showerhead insulating wall and thus preventing formation of a conductive thin film on the outside surface of the showerhead insulating wall.

13. The apparatus of claim 12, wherein the RF connection terminal has the shape of a tube so that an inert gas can flow, into it and a gap is formed between the plasma generation barrier wall and the showerhead insulating wall, thereby providing a passage for an inert gas.

14. The apparatus of claim 13, further comprising a symmetric buffered passage ways provided by forming a set of trenches on the top part of the showerhead insulating wall or the bottom part of the plasma generation barrier wall so that the inert gas supplied through the RF connection terminal flows uniformly through the gasp between the plasma generation barrier wall and the showerhead insulating wall.

15. The apparatus of claim 11, wherein the RF connection terminal is connected to the showerhead assembly through the reactor wall, the plasma generation barrier wall, and the showerhead insulating wall, and is electrically insulated from the reactor wall as well as the plasma generation barrier wall.

16. The apparatus of claim 11, further comprising a reactor body having a gas inlet tube and a gas outlet tube with an on-off switch, respectively, the reactor body forming an outer wall surrounding a specified region of the reactor wall and the substrate carrier.

17. The apparatus of claim 16, wherein the RF connection terminal is connected to the showerhead assembly through the reactor body, the reactor wall, the plasma generation barrier wall, and the showerhead insulating wall in order to apply an RF power, and is electrically insulated from the reactor body, the reactor wall, and the plasma generation barrier wall.

18. The apparatus of claim 11, wherein the gas inlet tube is inserted into the opening at the top of the reactor wall with a diameter less than the opening of the reactor wall, and the gas outlet tube is installed in the opening so that the gas supplied to the reaction space passes through a space (gap) between the reactor wall and the plasma generation barrier wall, and is discharged through a gap between the reactor wall and the gas inlet tube.

19. A plasma enhanced atomic layer deposition (PEALD) apparatus for depositing a thin film on a substrate, the apparatus comprising:
a substrate carrier for supporting the substrate;
a reactor wall defining the interior of reactor together with said substrate carrier and having an opening at the top thereof;
a gas inlet tube for supplying a gas into said reactor;
a showerhead assembly having a volume adjusting horn for minimizing the volume of a reaction space and for allowing smooth and even flow of a gas;
a gas outlet tube for removing gas from said reaction space; and
a radio frequency (RF) power connection terminal connected to the showerhead assembly in order to apply RF power.

20. The apparatus of claim 19, further comprising a showerhead insulating wall surrounding the top and sides of said showerhead assembly.

21. The apparatus of claim 19, wherein said RF power connection terminal is connected to said volume adjusting horn through said reactor wall, and is electrically insulated from said reactor wall.

22. The apparatus of claim 19, further comprising a reactor body having an inert gas inlet port and an inert gas outlet port with on/off valves and surrounding reactor parts including said substrate carrier.

23. The apparatus of claim 22, wherein the RF connection terminal is connected to the volume adjusting horn through said reactor body and said reactor wall in order to apply RF power, and is electrically insulated from said reactor body and said reactor wall.

24. The apparatus of claim 19, wherein a gas inlet tube is installed in the opening at the top center of said reactor wall and a gas outlet tube is installed in the opening at the top center of said reactor wall and a gas outlet tube is installed in the opening at the top center, concentrically outside of said gas inlet tube and flows through the interior of said reactor and then exhausted through said gas outlet tube.

25. A plasma enhanced atomic layer deposition (PEALD) apparatus for depositing a thin film on a substrate, the apparatus comprising:
a substrate carrier for supporting a substrate;
a reactor wall defining the interior of the reactor together with said substrate carrier and having an opening at the top thereof;
a gas inlet tube for supplying a gas into said reactor;
a showerhead, assembly to which a gas inlet is connected and installed within said reactor wall defining a reaction space together with said substrate carrier and for supplying a gas to said reaction space;
a micro-feeding tube assembly made of insulating material disposed between the gas inlet tube and the shower head for preventing generation of plasma due to potential difference between the gas inlet tube and the shower head while maintaining the flow of gas introduced from the gas inlet tube, the micro feeding tube having a plurality of narrow tubes connected in parallel;
a showerhead insulating wall surrounding the top and sides of said showerhead assembly;
a plasma generation barrier wall installed with a gap between said showerhead insulating wall and said reactor wall and having no potential difference with respect to said reactor wall;
a gas outlet tube for removing a gas from said reaction space; and
a radio frequency (RF) power connection terminal connected to the showerhead assembly for applying RF power.

26. The apparatus of claim 25, wherein the showerhead assembly includes a gas dispersion perforated grid and a volume adjusting horn connected to a micro-feeding tube assembly through a hole at the center of said volume adjusting horn.

27. The apparatus of claim 25, wherein each of the plurality of the small tubes of the micro-feeding tube assembly has a diameter small enough to prevent plasma generation.

28. The apparatus of claim 25, wherein an inert gas forced to flow through the gap between the plasma generation barrier wall and the showerhead insulting wall, thereby blocking the gas supplied to the reaction space from being flow into the gap between the plasma generation barrier wall and the showerhead insulating wall and thus preventing formation of a conductive thin film on the outside surface of the showerhead insulating wall.

29. The apparatus of claim 28, wherein the RF connection terminal has the shape of a tube so that an inert gas can flow, into it and a gap is formed between the plasma generation barrier wall and the showerhead insulating wall, thereby providing a passage for an inert gas.

30. The apparatus of claim 29, further comprising a symmetric buffered passage ways provided by forming a set of trenches on the top part of the showerhead insulating wall or the bottom part of the plasma generation barrier wall so that the inert gas supplied through the RF connection terminal tube flows uniformly through the gap between the plasma generation barrier wall and the showerhead insulating wall.

31. The apparatus of claim 25, wherein the gas inlet tube is inserted into the opening at the top of the reactor wall with a diameter less than the opening of the reactor wall, and the gas outlet tube is installed in the opening so that the gas supplied to the reaction space passes through a space between the reactor wall and the plasma generation barrier wall, and is discharged through a gap between the reactor wall and the gas inlet tube.

32. The apparatus of claim 25, wherein the RF connection terminal is connected to the showerhead assembly through the reactor wall, the plasma generation barrier wall, and the showerhead insulating wall, and is electrically insulated form the reactor wall as well as the plasma generation barrier wall.

33. The apparatus of claim 11, further comprising a reactor body having an inert gas inlet port and an inert gas outlet port with on/off valves and surrounding reactor parts including said substrate carrier.

34. The apparatus of claim 33, wherein the RF connection terminal is connected to the showerhead assembly through the reactor body, the reactor wall, the plasma generation barrier wall, and the showerhead insulating wall in order to apply an RF power, and is electrically insulated from the reactor body, the reactor wall, and the plasma generation barrier wall.

35. The apparatus of claim 25, further comprising a gas sealer ring covering the substrate carrier and connecting to the reactor wall in order provide sealing of the inner part of the reactor.

36. The apparatus of claim 25, further comprising a heater installed to surround the sidewall of the reactor wall.

37. The apparatus of claim 25, further comprising a heater installed underneath of the substrate carrier for heating the substrate.

38. The apparatus of claim 25, wherein the substrate carrier moves up and down so that the substrate is loaded into or unloaded from the reaction space.

39. A method of forming a conductive thin film on a substrate, the method comprising the steps of:

preparing a process gas containing desired metallic components;

loading a substrate into a reaction space defined in part by a gas injection assembly, and a reactor wall, the gas injection assembly having a gas injection face and an adjacent side wall, the gas injection assembly protruding from the reactor wall such that a space is formed between the side wall of the gas injection assembly and the reactor wall;

supplying said source gas containing metallic components to said reaction space through a gas inlet tube;

ceasing to supply said source gas and supplying $H_2$ or $H_2$ containing purge gas to said reaction space through said gas inlet tube;

generating plasma to activate said purge gas for a specified period of time while said purge gas is continuously supplied;

exhausting gas from the reaction space through the space between the gas injection assembly side wall and the reactor wall; and purging said reaction space using said purge gas;

wherein the step of supplying said source gas, the step of supplying said purge gas, the step of generating plasma, and the step of purging are repeated specified number of times.

40. The method of claim 39, wherein a micro-feeding tube assembly in which a plurality of small tubes are connected in parallel is installed at the end of said gas inlet tube, and the process gases are supplied through said gas inlet tube and then through said micro-feeding tube assembly.

41. The method of claim 39, wherein said source gas includes Titanium Tetra-Chloride ($TiCl_4$).

42. The method of claim 39, wherein the gas injection assembly comprises a showerhead assembly.

43. The method of claim 39, further comprising discharging the exhausted gas through a gap between the reactor wall and the gas inlet tube.

44. The method of claim 39, wherein said conductive thin film is titanium nitride (TiN).

45. The method of claim 39, wherein said purge gas includes $H_2$ and $N_2$ gases.

46. The method of claim 39, wherein said conductive thin film is titanium metal.

* * * * *

UNITED STATES PATENT AND TRADEMARK OFFICE
CERTIFICATE OF CORRECTION

| | |
|---|---|
| PATENT NO. | : 7,138,336 B2 |
| APPLICATION NO. | : 10/486311 |
| DATED | : November 21, 2006 |
| INVENTOR(S) | : Lee et al. |

It is certified that error appears in the above-identified patent and that said Letters Patent is hereby corrected as shown below:

Title page, Item (75) (Inventors), please delete "(JP);" and insert --(KR);--, therefor.

Title page, Item (57) (Abstract), line 12, please delete "reation" and insert --reaction--, therefor.

In Col. 4, line 5, please delete "hard," and insert --hand,--, therefor.

In Col. 5, line 63, after "and" please delete "is".

In Col. 7, line 50, after "invention", please insert --.--.

In Col. 8, line 33, after "process" please delete "552.".

In Col. 8, line 43, please delete "on" and insert --an--, therefor.

In Col. 8, line 55, please delete "he" and insert --be--, therefor.

In Col. 9, line 1, after "filling" please delete "a" and insert --an--, therefor.

In Col. 9, line 32, please delete "form" and insert --from--, therefor.

In Col. 10, line 32, please delete "process," and insert --process--, therefor.

In Col. 12, line 48, please delete "When a" and insert --when an--, therefor.

In Col. 14, line 2, after "substrate carrier" please insert --560--.

In Col. 14, line 2, after "to" please delete "an" and insert --a--, therefor.

Signed and Sealed this
First Day of February, 2011

David J. Kappos
*Director of the United States Patent and Trademark Office*

CERTIFICATE OF CORRECTION (continued)
U.S. Pat. No. 7,138,336 B2

In Col. 15, line 5, after "once" please delete "The" and insert --the--, therefor.

In Col. 15, line 9, please delete "he" and insert --be--, therefor.

In Col. 16, line 62, please delete "vary" and insert --very--, therefor.

In Col. 17, line 50 (approx.), Claim 4, please delete "form" and insert --from--, therefor.

In Col. 18, line 50 (approx.), Claim 14, please delete "gasp" and insert --gap--, therefor.

In Col. 19, line 49, Claim 24, after "tube" please insert --so that the gas supplied to the reaction space through said gas inlet tube--.

In Col. 19, line 59, Claim 25, after "inlet", please insert --tube--.

In Col. 20, line 26, Claim 28, please delete "insulting" and insert --insulating--, therefor.

In Col. 20, line 28, Claim 28, please delete "flow" and insert --flown--, therefor.

In Col. 20, line 58 (approx.), Claim 32, please delete "form" and insert --from--, therefor.